(12) United States Patent
Mabuchi

(10) Patent No.: US 7,989,253 B2
(45) Date of Patent: Aug. 2, 2011

(54) METHOD OF FORMING MASK FOR LITHOGRAPHY, METHOD OF FORMING MASK DATA FOR LITHOGRAPHY, METHOD OF MANUFACTURING BACK-ILLUMINATED SOLID-STATE IMAGING DEVICE, BACK-ILLUMINATED SOLID-STATE IMAGING DEVICE AND ELECTRONIC DEVICE

(75) Inventor: Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 253 days.

(21) Appl. No.: 12/395,948

(22) Filed: Mar. 2, 2009

(65) Prior Publication Data
US 2009/0243022 A1 Oct. 1, 2009

(30) Foreign Application Priority Data
Mar. 26, 2008 (JP) ................................. 2008-080008

(51) Int. Cl.
*H01L 21/00* (2006.01)

(52) U.S. Cl. .................................. 438/57; 257/E27.122

(58) Field of Classification Search .................... 438/57; 716/19, 21; 257/E27.122
See application file for complete search history.

(56) References Cited

U.S. PATENT DOCUMENTS
2008/0158137 A1* 7/2008 Yoshida ........................ 345/102

FOREIGN PATENT DOCUMENTS
JP 2003-031785 1/2003
* cited by examiner

*Primary Examiner* — David S Blum
(74) *Attorney, Agent, or Firm* — SNR Denton US LLP

(57) ABSTRACT

A method of forming a mask for lithography includes the step of forming the mask by using reverse data in which positions of at least part of output terminals are reversed, when forming the mask for lithography used for manufacturing a back-illuminated solid-state imaging device which takes incident light from the side of a surface opposite to the side of a surface on which wiring of a device region in which photoelectric conversion elements are formed is formed.

10 Claims, 12 Drawing Sheets

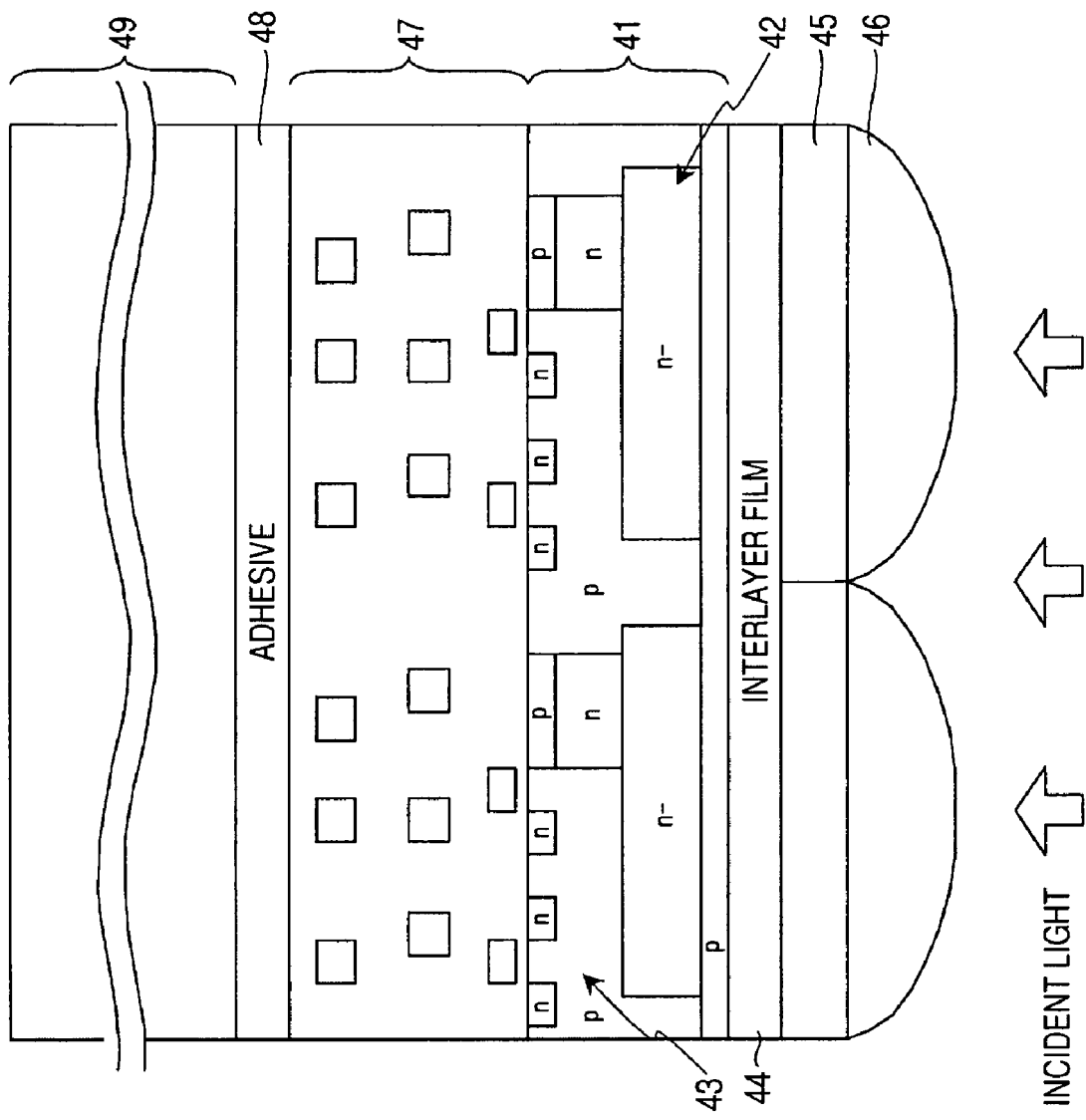

DESIGN DATA OF CHIP

REVERSE THE WHOLE CHIP →

REVERSE MASK DATA

I/O DRAWING

TAKEN IMAGE

EVALUATION BOARD

DESIGN DATA OF CHIP

DATA OF MATCHING MARK

REVERSE THE WHOLE CHIP

REVERSE MASK DATA

FIG. 6A  MASK OF FRONT-FACE PROCESS
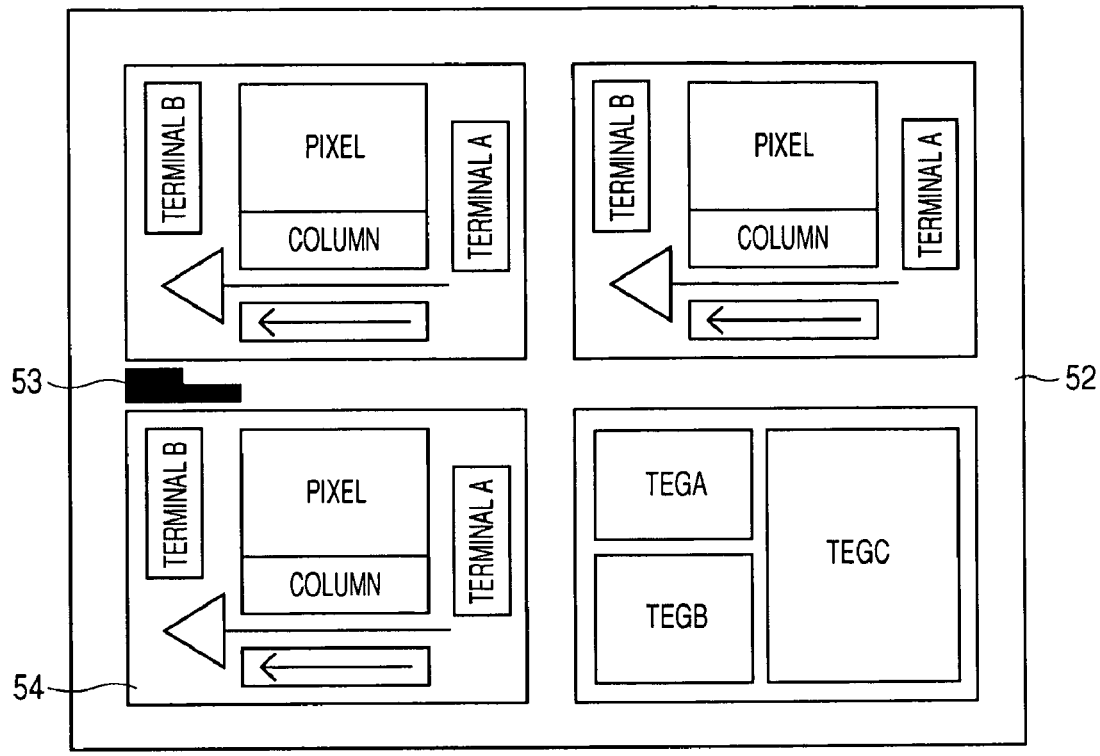
FIG. 6B  MASK OF BACK-FACE PROCESS
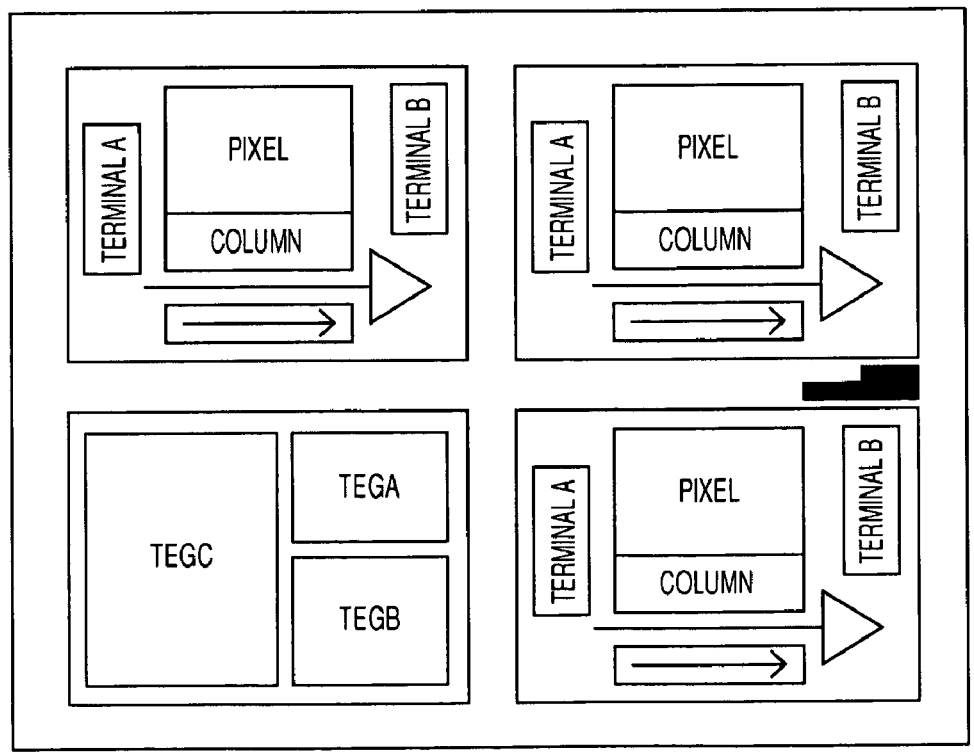

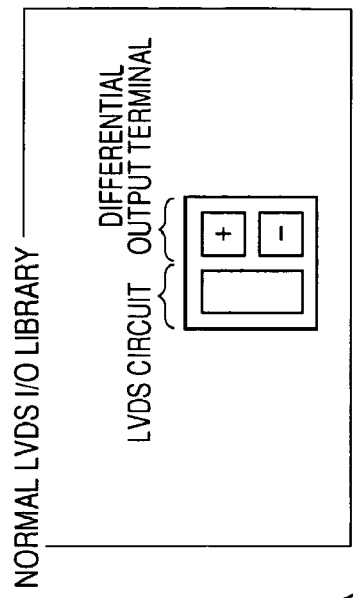
FIG. 7A
DESIGN DATA OF CHIP
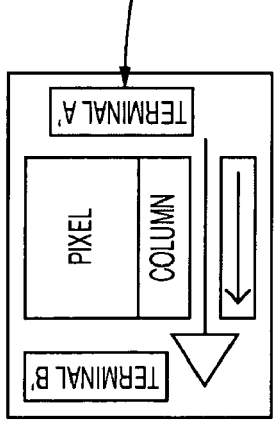
FIG. 7B
I/O DRAWING
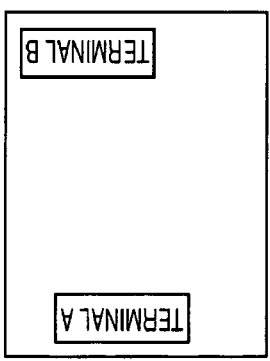
FIG. 7C
TAKEN IMAGE
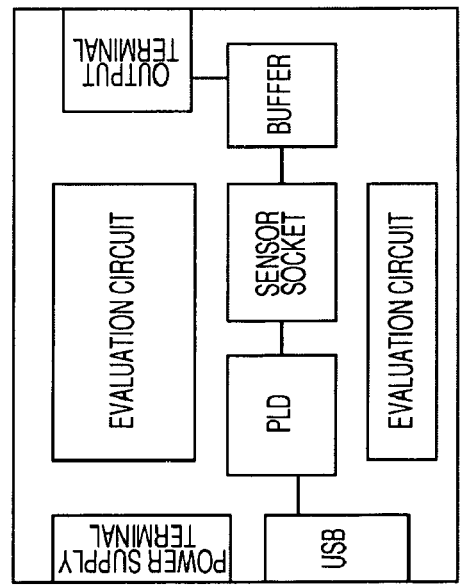
FIG. 7D
EVALUATION BOARD
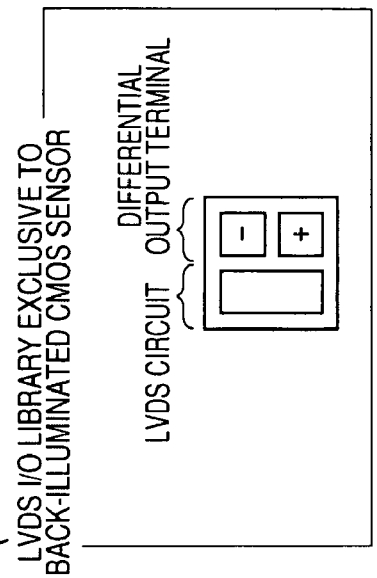
FIG. 7E
NORMAL LVDS I/O LIBRARY
FIG. 7F
LVDS I/O LIBRARY EXCLUSIVE TO BACK-ILLUMINATED CMOS SENSOR

TAKEN IMAGE

TAKEN IMAGE

DESIGN DATA OF
FRONT-ILLUMINATED TYPE

DESIGN DATA OF
BACK-ILLUMINATED CHIP

I/O DRAWING

I/O DRAWING (REVERSAL)

EVALUATION BOARD

EVALUATION BOARD

DESIGN DATA OF BACK-ILLUMINATED CHIP

I/O DRAWING (REVERSAL)

EVALUATION BOARD

DESIGN DATA OF
BACK-ILLUMINATED CHIP

I/O DRAWING

EVALUATION BOARD

THEY ARE NOT THE SAME BECAUSE,
FOR EXAMPLE, + AND - OF LVDS
ARE REVERSED

METHOD OF FORMING MASK FOR LITHOGRAPHY, METHOD OF FORMING MASK DATA FOR LITHOGRAPHY, METHOD OF MANUFACTURING BACK-ILLUMINATED SOLID-STATE IMAGING DEVICE, BACK-ILLUMINATED SOLID-STATE IMAGING DEVICE AND ELECTRONIC DEVICE

CROSS REFERENCE TO RELATED APPLICATIONS

The present invention contains subject matter related to Japanese Patent Application JP 2008-080008 filed in the Japanese Patent Office on Mar. 26, 2008, the entire contents of which being incorporated herein by reference.

BACKGROUND OF THE INVENTION

1. Field of the Invention

The invention relates to a method of forming a mask for lithography, a method of forming mask data for lithography, a method of manufacturing a back-illuminated solid-state imaging device and the back-illuminated solid-state imaging device and an electronic device.

2. Description of the Related Art

As a one of solid-state imaging devices, there is a so-called back-illuminated CMOS image sensor which takes incident light from the side of a surface (back face) opposite to a surface (front face) on which a wiring portion of a device region in which photoelectric conversion elements are formed is formed (for example, refer to JP-A-2003-31785 (Patent Document 1)). It is not necessary to arrange respective metal wiring of a wiring layer in consideration of a light receiving surface by applying a structure of taking incident light from the back side, therefore, flexibility of wiring is increased. As a result, it is possible to realize miniaturization of pixels and to increase the open area ratio.

Since a chip is mounted upside down in the back-illuminated CMOS image sensor, a taken image is mirror-reversed with respect to a front-illuminated CMOS image sensor. For example, when a taken image of the front-illuminated type is an image shown in FIG. 9A, a taken image of the back-illuminated CMOS image sensor is mirror-reversed with respect to the front-illuminated taken image as shown in FIG. 9B. In this case, in order to allow the taken image of the back-illuminated type and the taken image of the front-illuminated type to have the same left-to-right relationship, a mirror reverse function using a line memory and the like have to be provided at a signal processing IC in a sequential stage.

SUMMARY OF THE INVENTION

In addition to the above, the following disadvantages occur in the back-illuminated CMOS image sensor in which the taken image is mirror-reversed with respect to the taken image of the front-illuminated CMOS image sensor. FIG. 10A and FIG. 10B show design data of chips of a front-illuminated (A) and a back-illuminated (B) CMOS image sensors as examples.

First, as shown in FIG. 11A and FIG. 11B, an I/O drawing (terminal drawing) in which terminal positions of the CMOS image sensor are prescribed is mirror-reversed. The case of the front-illuminated type is shown in FIG. 11A and the case of the back-illuminated type is shown in FIG. 11B, respectively. When the I/O drawing in which terminal positions are prescribed is mirror-reversed in this manner, it is necessary to redesign a board on which the sensor is mounted at the time of evaluation or as a product as shown in FIG. 12A and FIG. 12B.

The case of the front-illuminated type is shown in FIG. 12A and the case of the back-illuminated type is shown in FIG. 12B, respectively. An evaluation circuit indicates a circuit including a regulator, various check terminals and the like.

However, all we have to do is not simply redesign of the board so as to be mirror-reversed because of the following reasons. As one of the reasons, directions in which signals are inputted or outputted, positions of power supply terminals and the like are usually fixed at positions so as to be easily used, therefore, it is not desirable that these positions are mirror-reversed.

As another reason, even when terminal positions of power supply terminals and the like of the sensor are mirror-reversed, terminal positions of other devices such as a PLD (Programmable Logic Device) are not mirror-reversed, therefore, wiring between them is not sufficient by being simply mirror-reversed. Specifically, the CMOS image sensor will have a form in which wiring is performed so as to reverse the input-output relationship as shown in FIG. 12B.

Concerning the wiring as described above, wiring may be performed on the board or a conversion connector between a sensor package and a socket may used. However, the wiring is considerably difficult and noise is liable to occur when applying either of these countermeasures because more than several dozen of wirings intersect. Particularly, when using the conversion connector, the height from the board surface changes, which is a disadvantage for the image sensor.

If there exists the back-illuminated CMOS image sensor by itself, there is no problem of reversal of signals and terminal positions, and an evaluation system, a signal processing IC of a subsequent stage, a system, a camera and the like may be formed so as to correspond to the sensor. However, the back-illuminated CMOS image sensor actually coexists with the front-illuminated CMOS image sensor on the grounds of tradeoff between costs and performance. In this case, it is not desirable that right and left of signals, positions of input/output terminals and the like change on a great scale.

The following countermeasures have been applied to the above advantages in the past. The simplest countermeasure is that design data of a chip as shown in FIG. 13A is designed so as to perform reverse scanning in the horizontal scanning direction. In this case, the taken image will be normal as shown in FIG. 9A. Therefore, the processing system of the subsequent stage in related art can be used as it is.

However, terminal positions are reserved by turning over the chip as shown in FIG. 13B, the problem of the board on which the sensor is mounted (FIG. 13C) remains. Even when the existing front-illuminated chip is used as the back-illuminated chip, the board has to be made again. In a test in a state of wafer, complication and costs are generated for forming a probe for mirror-reversal and for allowing software to address the mirror-reversal.

Fundamentally, as shown in FIG. 14B, it is necessary to design the chip from the beginning so that the terminal positions are placed in the mirror-reversed manner. The design from the beginning seems to have no problem, but actually there are disadvantages. The CMOS image sensor is designed using IP (Intellectual Property). The back-illuminated type is also designed by using the IP of a common CMOS library, which is naturally used in the front-illuminated type.

For example, when focusing on differential input/output terminals such as a case in which an output state of the CMOS image sensor has a differential output configuration, a positive terminal and a negative terminal are replaced with each other. As a result, specifications which are usually common to all CMOS LSI not limited to the CMOS image sensors become different in the back-illuminated type, and disadvantages such that measurement or mounting on the camera have to be performed individually.

Particularly, when making the sensor compatible with the front-illuminated type, it is necessary to reconfigure the whole block arrangement and wiring in the same manner as the above example of the sensor mounting board because directions of terminals of IP are not changed even in an internal block. Therefore, it is not certain that the layout which is optimized by reducing waste in the front-illuminated type fits the size of the back illuminated type in the first place.

Thus, it is desirable to provide a method of forming a mask for lithography, a method of forming mask data for lithography, a method of manufacturing a back-illuminated solid-state imaging device, the back-illuminated solid-state imaging device and an electronic device, which can deal with the back-illuminated type, not distinguished from the front-illuminated type.

According to an embodiment of the invention, when forming mask data for lithography used for manufacturing a back-illuminated solid-state imaging device which takes incident light from the side of a surface opposite to the side of a surface on which wiring of a device region in which photoelectric conversion elements are formed is formed, reverse data in which positions of at least part of output terminals are reversed is regarded as mask data for lithography and the mask is formed by using the mask data.

The mask is formed by using reverse data in which positions of at least part of output terminals are reversed, thereby manufacturing a solid-state imaging device which can deal with the back-illuminated type, not distinguished from the front-illuminated type. The back-illuminated solid-state imaging device thus manufactured can be used by being applied on an electric device using a solid-state imaging device in an image taking unit (photoelectric conversion unit) as the solid-state imaging device.

According to an embodiment of the invention, the back-illuminated type can be dealt with, not distinguished from the front-illuminated type, therefore, it is not necessary to request an evaluation board on which the back-illuminated CMOS image sensor is mounted or a signal processing IC in a subsequent stage to have particular specifications as well as to increase costs for them.

BRIEF DESCRIPTION OF THE DRAWINGS

FIG. 3 is a cross-sectional view showing an example of a back-illuminated type pixel structure;

FIG. 6A and FIG. 6B are diagrams showing examples of mask configurations, in which FIG. 6A shows a mask of a front-face process and FIG. 6B shows a mask of a back-face process;

FIG. 7A to FIG. 7F are conceptual diagrams of design of a back-illuminated CMOS image sensor according to Second Embodiment;

FIG. 11A and FIG. 11B are diagrams showing I/O drawings (terminal drawings) prescribing terminal positions the CMOS image sensors, in which FIG. 11A shows the case of the front-illuminated type and FIG. 11B shows the case of the back-illuminated type;

FIG. 12A and FIG. 12B are diagrams showing boards on which the sensor is mounted at the time of evaluation or as a product, in which FIG. 12A shows the case of the front-illuminated type and FIG. 12B shows the case of the back-illuminated type;

DESCRIPTION OF THE PREFERRED EMBODIMENTS

Hereinafter, embodiments of the invention will be explained in detail with reference to the drawings.

[Solid-State Imaging Device]

Figure 1:
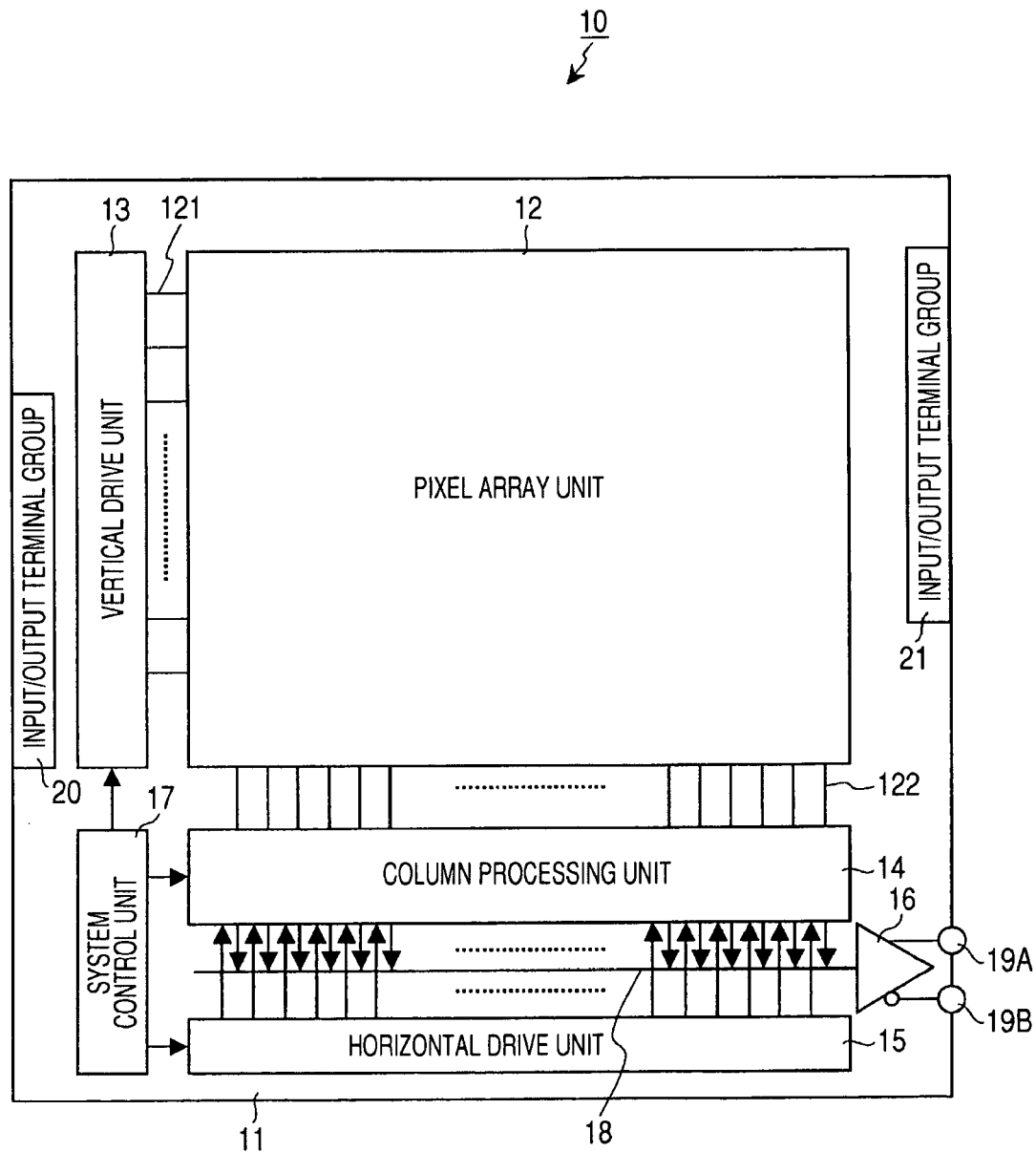
FIG. 1 is a system configuration diagram showing an outline of a back-illuminated CMOS image sensor to which an embodiment of the invention is applied.

FIG. 1 is a system configuration diagram showing an outline of a system configuration of a back-illuminated solid-state imaging device, for example, a back-illuminated CMOS image sensor, to which an embodiment of the invention is applied.

As shown in FIG. 1, a CMOS image sensor 10 according to an application example includes a pixel array unit 12 formed on a semiconductor substrate (chip) 11 and a peripheral circuit portion integrated on the same chip 11 as the pixel array portion 12. As the peripheral circuit portion, for example, a vertical drive unit 13, a column processing unit 14, a horizontal drive unit 15, an output circuit unit 16 and a system control unit 17 are provided.

In the pixel array unit 12, unit pixels (which are sometimes written as merely "pixels" in the following description) each having a photoelectric conversion element which generates light charges of the electric charge amount corresponding to the incident light amount and accumulates the light charges inside are arranged two-dimensionally in a matrix state. A specific configuration of the unit pixel will be described later.

In the pixel array unit 12, pixel drive lines 121 are arranged with respect to each line of matrix-state pixel arrangement along the horizontal direction/row direction (arrangement direction of pixels of pixel rows) and vertical signal lines 122 are arranged with respect to each column along the vertical direction/column direction (arrangement direction of pixels of pixel columns). In FIG. 1, one pixel drive line 121 is shown, it is not limited to one. One end of the pixel drive line 121 is connected to an output terminal corresponding to each row in the vertical drive unit 13.

The vertical drive unit 13 includes a shift register, an address decoder and the like, which is a pixel drive unit driving all pixels of the pixel array unit 12 simultaneously or driving respective pixels by each row. The vertical drive unit 13 usually includes two scanning systems of a reading scanning system and a sweep scanning system, though the specific configuration thereof is not shown.

The reading scanning system selectively scans unit pixels of the pixel array unit 12 sequentially for reading signals from the unit pixels. The sweep scanning system performs sweep scanning with respect to a reading row which is scanned by the reading scanning system before the reading scanning by the time of shutter speed.

According to the sweep scanning by the sweep scanning system, unnecessary charges are swept out (reset) from the photoelectric conversion elements of unit pixels of the reading row. Then, a so-called electronic shutter operation is performed by the sweeping (reset) of unnecessary charges by the sweep scanning system. The electronic shutter operation means an operation in which light charges of the photoelectric conversion elements are swept off and exposure is started anew (accumulation of light charges is started).

A signal read by the reading operation by the reading scanning system corresponds to the light amount incident after the reading operation just before or the electronic shutter operation. A period from the reading timing by the reading operation just before or the sweeping timing by the electronic shutter operation until the reading timing by the reading operation at this time will be accumulation time (exposure time) of light charges in the unit pixel.

Signals outputted from respective unit pixels of the pixel row which have been selectively scanned by the vertical drive unit 13 are supplied to the column processing unit 14 through each vertical signal line 122. The column processing unit 14 performs a prescribed signal processing to signals outputted through the vertical signal line 122 of the selected row by each pixel column of the pixel array unit 12 as well as temporarily holds the pixel signals after the signal processing.

Specifically, the column processing unit 14 performs signal processing with respect to the signals received from respective unit pixels, which are, for example, noise elimination by CDS (Correlated Double Sampling), signal amplification, AD (analog-digital) conversion and the like. Fixed pattern noise peculiar to pixels such as reset noise or variation of threshold values of an amplification transistor is eliminated. The signal processing exemplified here is just examples, not limited to the above.

The horizontal drive unit 15 includes a shift register, an address decoder and the like, sequentially selects unit circuits corresponding to pixel columns in the column processing unit 14. According to the selection scanning by the horizontal drive unit 15, pixel signals processed in the column processing unit 14 are outputted sequentially to a horizontal bus 18 and transmitted to the output circuit unit 16 by the horizontal bus 18.

The output circuit unit 16 processes signals transmitted by the horizontal bus 18 and outputs them. As the processing in the output circuit unit 16, in addition to a case that only buffering processing is performed, various digital signal processing such as adjusting the black level before the buffering or correcting variations by each column can be cited.

The output circuit unit 16 has a differential output configuration which outputs differential signals from an output stage thereof. Specifically, the output stage of the output circuit unit 16 outputs signals transmitted by the horizontal bus 18 by processing them as positive-phase signals as well as outputs the signals by inverting polarity as negative-phase signals. As the output stage of the output circuit unit 16, for example, a LVDS (Low Voltage Differential Signal) circuit is used.

The positive-phase signals are outputted to the outside of the chip 11 through a positive-phase output terminal 19A and the negative-phase signals are outputted to the outside of the chip 11 through a negative-phase output terminal 19B. When the output stage of the output circuit unit 16 has the differential output configuration, the signal processing unit provided outside the chip 11, for example, a signal processing IC receives positive-phase and negative-phase signals at an input stage of a differential circuit configuration.

The output stage of the output circuit unit 16 has the differential output configuration and the input stage of the signal processing IC has the differential circuit configuration, thereby transmitting information by electric current between the output stage of the output circuit unit 16 and the input stage of the signal processing IC. Accordingly, even when a transmission path between the output stage of the output circuit unit 16 and the input stage of the signal processing IC is long, charge and discharge at the transmission path becomes small, as a result, high speed processing of the system can be realized.

The system control unit 17 receives the clock given from the outside of the chip 11, data indicating an operation mode and the like as well as outputs data such as internal information of the CMOS image sensor 10. The system control unit 17 further includes a timing generator generating various timing signals, performing drive control of the peripheral circuit portion such as the vertical drive unit 13, the column processing unit 14 and the horizontal drive unit 15 based on various timing signals generated in the timing generator.

Respective terminals of the input/output terminal groups 20, 21 including the power supply terminal are provided in a periphery of the chip 11. The input/output terminal groups 20, 21 give and receive power supply voltage and signals between the inside and the outside of the chip 11. Positions of arranging the input/output terminal groups 20, 21 are determined to be user-friendly positions in consideration of the directions in which signals are inputted and outputted.

(Pixel Circuit)

Figure 2:
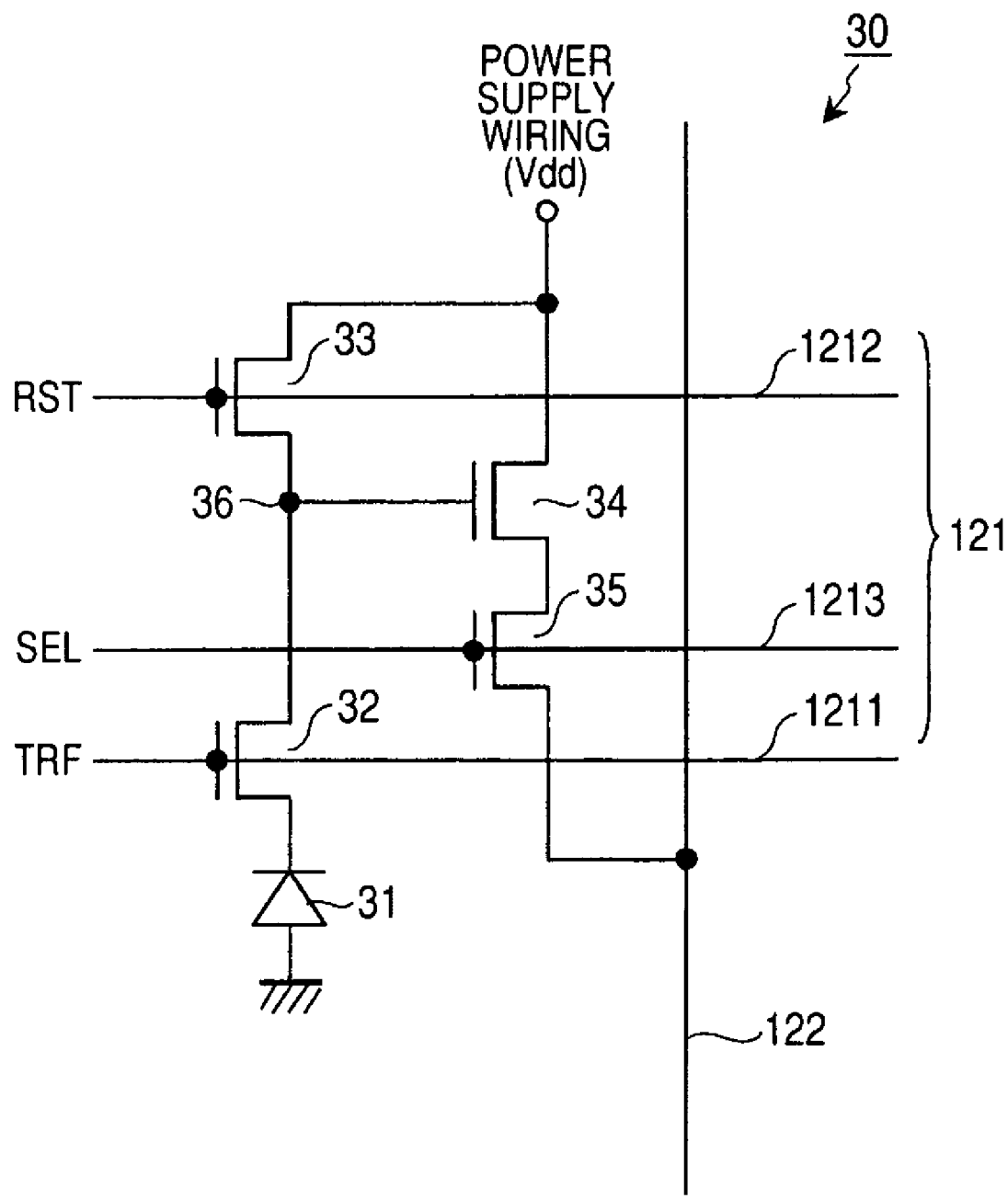
FIG. 2 is a circuit diagram showing an example of a circuit configuration of a unit pixel.

FIG. 2 is a circuit diagram showing an example of a circuit configuration of a unit pixel 30. The unit pixel according to the circuit example includes a photodiode 31 which is a photoelectric conversion element, and four transistors, for example, a transfer transistor 32, a reset transistor 33, an amplification transistor 34 and a selection transistor 35. In this case, as the transistors 32 to 35, for example, an N-channel MOS transistor is applied, however, it is not limited to this.

As the above-described pixel drive line 121, a transfer control line 1211, a reset control line 1212 and a selection control line 1213 are arranged for controlling driving of the transfer transistor 32, the reset transistor 33 and the selection transistor 35.

The transfer transistor 32 is connected between a cathode electrode of the photodiode 31 and a floating diffusion capacitance 36. Light charges (electrons in this case) which are photoelectrically converted in the photodiode 31 and accumulated therein are transferred to the floating diffusion capacitance 36 by a transfer pulse TRG being given to a gate electrode through the transfer control line 1211. The floating diffusion capacitance 36 functions as a charge-voltage converter which converts light charges into a voltage signal.

A drain electrode of the reset transistor 33 is connected to a pixel power source of a power supply voltage Vdd and a source electrode thereof is connected to the floating diffusion capacitance 36 respectively. The reset transistor 33 resets a potential of the floating diffusion capacitance 36 by a reset pulse RST given to a gate electrode through the reset control line 1212 before the transfer of light charges from the photodiode 31 to the floating diffusion capacitance 36.

A gate electrode of the amplification transistor 34 is connected to the floating diffusion capacitance 36 and a drain electrode thereof is connected to the pixel power source of the power supply voltage VDD. The amplification transistor 34 outputs the potential of the floating diffusion capacitance 36 which has been reset by the reset transistor 33 as a reset level, and further outputs the potential of the floating diffusion capacitance 36 after light charges were transferred by the transfer transistor 32 as a signal level.

A drain electrode of the selection transistor 35 is connected to a source electrode of the amplification transistor 34 and a source electrode thereof is connected to the vertical signal line 122 respectively, which becomes on-state by a selection pulse SEL given to a gate electrode through the selection control line 1213, outputting a signal outputted from the amplification transistor 34 in a state of selecting the pixel 30 to the vertical signal line 122. It is possible to apply a configuration in which the selection transistor 35 is connected between the power supply voltage Vdd and the drain electrode of the amplification transistor 34.

In this case, the unit pixel 30 having four transistors including the transfer transistor 32, the reset transistor 33, the amplification transistor 34 and the selection transistor 35 is cited as an example, however, it is just one example. That is, the unit pixel 30 is not limited to the pixel configuration of four transistors.

(Pixel Configuration of Back-Illuminated Type)

FIG. 3 is a cross-sectional view showing an example of a back-illuminated type pixel structure. In this case, a cross-sectional configuration of two pixels is shown.

In FIG. 3, in a silicon portion 41, a photodiode 42 and a pixel transistor 43 are formed. That is, the silicon portion 41 is a device region. In this case, the photodiode 42 corresponds to the photodiode 31 of FIG. 2. The pixel transistor 43 corresponds to the transistors 32 to 35 of FIG. 2.

On one surface side of the silicon portion 41, a color filter 45 and a non-chip lens 46 are formed through an interlayer film 44. According to this, light incident from one surface side of the silicon portion 41 is introduced to a light receiving surface of the photodiode 42 via the on-chip lens 46 and the color filter 45.

On the other surface side of the silicon portion 41, a wiring portion 47 in which the gate electrode and metal wiring of the pixel transistor 43 are wired. On a surface of the wiring portion 47, which is opposite to the silicon portion 41, a support substrate 49 is attached by an adhesive 48.

In the pixel configuration, the wiring portion 47 side of the silicon portion 41 in which photodiode 42 and the pixel transistor 43 are formed is referred to as the front-face side, and the other side of the silicon portion 41, which is opposite to the wiring portion 47 is referred to as the back-face side. Under such definition, the pixel configuration will be back-illuminated type pixel configuration because incident light is taken from the back-face side of the silicon portion 41.

In the following description, a process of forming the pixel transistor 43 at the front side of the silicon portion 41 and forming metal wiring in the wiring portion 47 in the back-illuminated type pixel configuration is referred to as a front-face process. In addition, a process of forming the color filter 45 and the on-chip lens 46 at the back-face side of the silicon portion 41 is referred to as a back-face process.

(Design of the Back-Illuminated CMOS Image Sensor)

Hereinafter, specific embodiments when designing the back-illuminated CMOS image sensor 10 will be explained.

Embodiment 1

As shown in FIG. 4A to FIG. 4D, design data (FIG. 4A) which is layout data of a chip of the back-illuminated CMOS image sensor 10 is designed in the same manner as the front-illuminated type by using an IP of the normal CMOS process without considering mirror reversal of a taken image (FIG. 4C) by the back illumination. Here, IP (Intellectual Property) means intellectual property (functional block) which has been already developed.

Figure 4A:
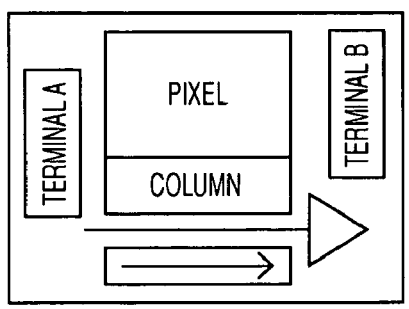
FIG. 4A to FIG. 4E are conceptual diagrams of design of a back-illuminated CMOS image sensor according to Embodiment 1.
Figure 4E:
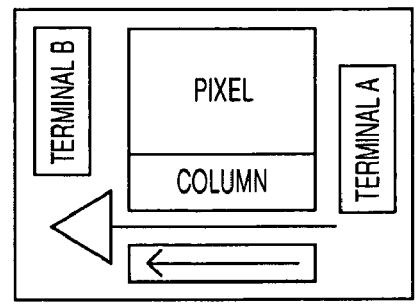
Figure 4B:
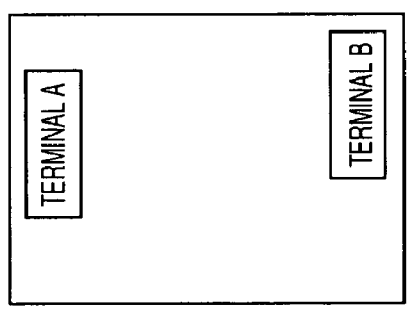
Figure 4C:
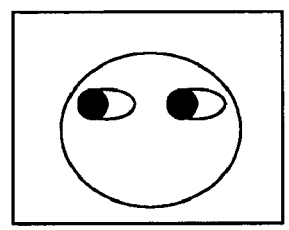
Figure 4D:
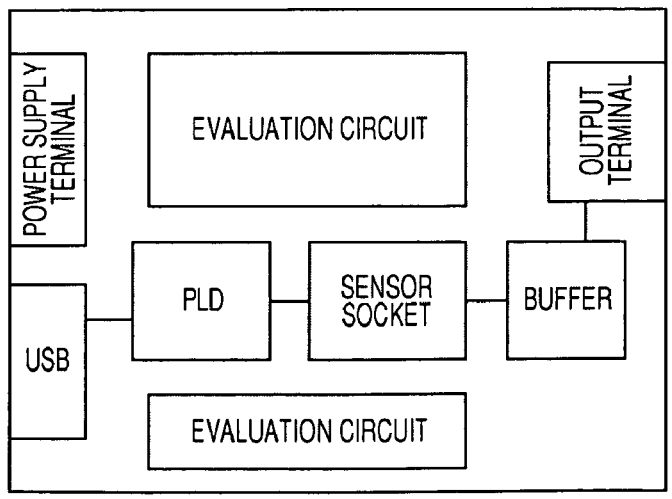

An I/O drawing (FIG. 4B) which is a terminal drawing and a signal drawing are formed as they are without considering mirror reversal of the taken image (FIG. 4C). After the layout data of the whole chip is made, the layout data, that is, design data (FIG. 4A) of the chip is mirror-reversed as the whole chip before being transcribed to a mask for photolithography for manufacture and reverse mask data (FIG. 4E) is formed anew in Embodiment 1.

The formation of the reverse mask data (FIG. 4E) can be easily realized by replacing all signs of x-coordinates of design data (FIG. 4A) of the chip which is original data. The manufacture of the back-illuminated CMOS image sensor 10 is performed by using a mask for lithography on which the layout based on the reverse mask data (FIG. 4E) is printed.

The CMOS image sensor 10 manufactured as described above is reversed as a whole, however, terminal positions as well as the obtained taken image are normal when seeing from the back-face side because the reverse is reversed. Concerning the differential output of the output circuit unit 16 shown in FIG. 1, the positive terminal and the negative terminal are not replaced.

When making a back-illuminated chip which is compatible with the front-illuminated chip is made, it is not necessary to perform the whole redesign as in related art. For example, it is not necessary to rewire between blocks in the chip. The chip having the same terminal positions and signal data can be formed just by replacing or changing parts of processes relating to the back-face side, using layout data of the front-illuminated type.

Figure 5A:
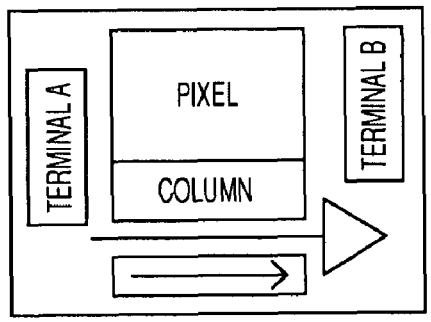
FIG. 5A to FIG. 5D are conceptual diagrams showing a procedure of forming a reverse mask data.
Figure 5B:
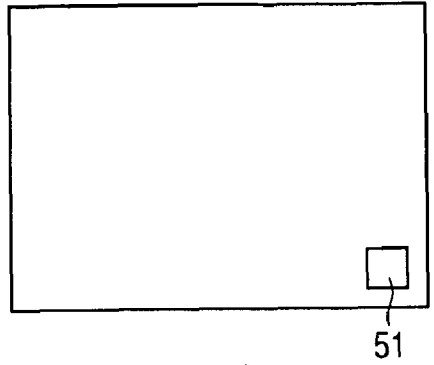
Figure 5C:
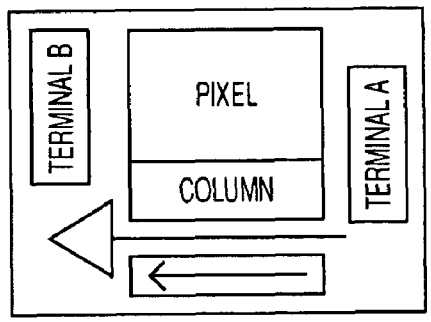
Figure 5D:
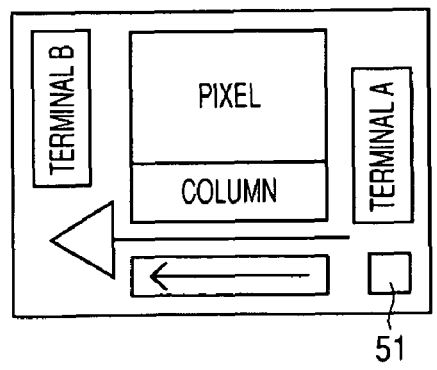

When forming the reverse mask data (FIG. 4E), the following processing is important. Specifically, as shown in FIG. 5A to FIG. 5D, a mark 51 to be arranged on the chip in marks in the front-face side is possessed as different data (layer) from the layout data (FIG. 5A) of the chip, that is, data of a matching mark (FIG. 5B). Before proceeding to the formation of the mask, the design data of the chip (FIG. 5A) is reversed to be reversed design data (FIG. 5C). The data of the matching mark (FIG. 5B) is not reversed. Then, the reversed design data (FIG. 5C) and the data of the matching mark (FIG. 5B) are superimposed to obtain reverse mask data (FIG. 5D).

Here, as the mark 51 arranged on the chip, a mark used for matching for lithography, a mark for using examination in manufacturing processes such as the line width and the film thickness, a mark for specifying the chip, a mark be used as a reference of coordinates at the time of examination in manufacturing processes and the like can be cited. That is, the mark 51 means all "signs" which can be recognized as marks, not related to operations of the chip.

The mark 51 arranged on the chip is possessed as different data from the layout data (FIG. 5A), the design data of the chip (FIG. 5A) is reserved and superimposed on the data of the matching mark (FIG. 5B) as it is to be the reverse mask data (FIG. 5D), thereby obtaining the following advantages. Specifically, occurrence of problems involved in the matching for the lithography on manufacturing processes or in the examination in the manufacturing processes can be prevented. The mark in the back-face side is reversed with the design data of the chip (FIG. 5A), therefore, it can be placed in the same layer as the design data (FIG. 5A). In the front-face process, a symmetrical mark or mark the shape of which is not determined can be placed in the same layer as the design data (FIG. 5A).

The chip data thus made as described above (that is, the reverse mask data) is set in a frame 52 as shown in FIG. 6A and FIG. 6B. Here, an example in which one chip is put in a TEG (Test Element Group) is shown. Also in the frame 52, various marks 53 exist such as a number of the mask, however, a method of forming the frame 52 will be the same as in related art. The detailed description thereof is omitted here.

As shown in FIG. 6A, a reverse mask data 54 to which the reverse process has been performed which has not performed in the past is fitted to the frame 52 which is the same as the related art, that is, to which the reverse operation is not performed. Each lithography mask (FIG. 6A) of the front-face process is formed based on the whole data. The mask (FIG. 6B) of the back-face process is formed based on data in which the frame and the whole chip accommodated therein are mirror-reversed. The whole reversal including the frame was also performed in the back-illuminated CMOS image sensor in related art, which is not a feature of Embodiment 1. Here, explanation is made in order to describe clearly the difference between the whole reversal including the frame in related art and the reversal of only the chip affecting the front-face process of Embodiment 1.

In the manufacturing process, attention should be paid to ion implantation with respect to a wafer (semiconductor substrate). Normally, the inclination to the wafer to which ion implantation is performed is determined based on chip data (reversal mask data) (for example, refer to JP-A-2000-223687). In Embodiment 1, chip data is reversed before the mask, therefore, it is preferable that the inclination of ion implantation is also mirror-reversed accordingly in the process of minding the inclination of the ion implantation. For example, when ion implantation is performed at an angle of 8 degrees from the left of the wafer in the normal state, ion implantation is performed at an angle of 8 degrees from the right in this case.

According to Embodiment 1 explained as the above, it is not necessary to consider the mirror reversal of the taken image due to the back illumination even for the development and design, therefore, there are advantages both for designers and manufacturers. Particularly, when forming the back-illuminated chip which is compatible with the front-illuminated chip, the whole redesign is not necessary as in related art and it is possible to make the chip in which terminal positions as well as signal data are the same by using layout data of the front-illuminated type.

Embodiment 2

For part of the IP, a library for back illumination is prepared separately. Here, the library means database in which basic logic gates, logic circuit blocks, cells and the like which are units for design are collected so as to use programs having particular functions from other programs.

As shown in FIG. 7A to FIG. 7F, an I/O cell in which differential input/output terminals, namely, positions of a terminal for positive-phase signals and a terminal for negative-phase signals are reversed is included in a library for back illumination. Design data of a chip (FIG. 7A) is designed by using the I/O cell at an interface portion, which are represented as a terminal A' and a terminal B' in FIG. 7A.

A normal LVDS I/O library is shown in FIG. 7E and a LVDS I/O library for a back-illuminated CMOS image sensor 10 is shown in FIG. 7F, respectively. The LVDS circuit is used for a circuit portion of an output stage at which differential signals, namely, a positive-phase signal and a negative-phase signal in the output circuit unit 16 shown in FIG. 1 are outputted as described above.

Figure 14A:
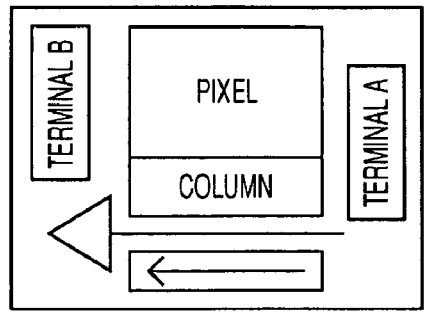
FIG. 14A to FIG. 14C are explanatory diagrams concerning Related Art 2.
Figure 14B:
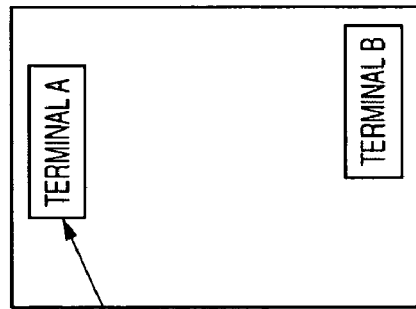
Figure 14C:
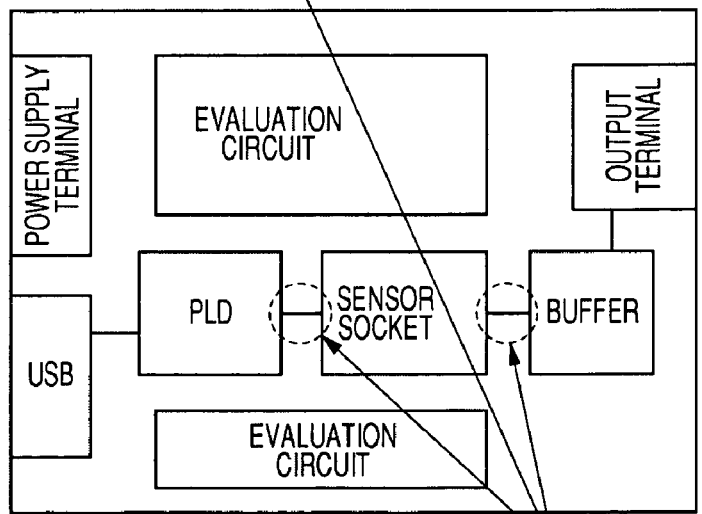

Then, the chip is designed so that all configurations are reversed as in the case of Related Art 2 shown in FIG. 14A to FIG. 14C. An I/O drawing (FIG. 7B) is a terminal drawing obtained by mirror-reversing the design data (FIG. 7A) of the chip. The taken image (FIG. 7C) represents positive reversal. Data used as a mask is used as it is, not reversing the whole chip. Accordingly, disadvantages at the interface portion can be solved.

When making a back-illuminated chip which is compatible with the front-illuminated chip, it is necessary to redesign the whole chip and the chip may not be formed in the same size in the same manner as the case of Related Art 2 shown in FIG. 14A to FIG. 14C. Accordingly, though the efficiency is reduced for the manufacturer, the same usability can be obtained for a user who is satisfied with the inside of the chip as a black box.

When making the back-illuminated image sensor 10 independently of the front-illuminated sensor, the reduction of efficiency does not occur. However, there remain the labor due to the management difference from the front-illuminated type in the library and various drawings, complication for designing in consideration of mirror-reversal of the taken image and the risk of inducing errors.

Operational Effects According to Embodiments 1, 2

The back-illuminated CMOS image sensor 10 is manufactured based on designs according to Embodiments 1, 2, thereby dealing with the back-illuminated type, not distinguished from the front-illuminated type. Accordingly, it is not necessary to request an evaluation board on which the back-illuminated CMOS image sensor 10 is mounted or a signal processing IC in a subsequent stage to have particular specifications as well as to increase costs for them.

Additionally, since the back-illuminated CMOS image sensor 10 can be used in the same manner as the front-illuminated CMOS image sensor of related art, there are the following advantages in electronic devices on which the CMOS image sensor 10 is mounted. Specifically, when making the back-illuminated chip which is compatible with the front-illuminated chip, the layout data for the front-illuminated type can be used without the whole redesign as in related art, therefore, it is possible to input products earlier as well as to reduce costs. In addition, the risk of unexpected disadvantages can be reduced.

The case that the invention is applied to the CMOS image sensor in which unit pixels detecting signal charges in accordance with the light amount of visible light as a physical value are arranged in a matrix state has been described as the example, however, the invention is not limited to the application to the CMOS image sensor and it is also preferable that the invention is applied to various types of solid-state imaging devices.

It is preferable that the solid-state imaging device is formed in a one-chip or formed in a module state having an imaging function, in which an imaging unit, a signal processing unit or an optical system are packaged together.

Application Example

The back-illuminated solid-state imaging device according to an embodiment of the invention can be applied by being mounted on various kinds of electronic devices using a solid-state imaging device in an image taking unit (photoelectric conversion unit). As electronic devices, imaging apparatuses such as a digital still camera and a video camera, portable terminal devices having the imaging function such as a cellular phone device, copying machines using a solid-state imaging device in an image reading unit can be cited as examples. There is a case in which the module state mounted on the electronic device, that is, a camera module is regarded as an imaging apparatus.

(Imaging Apparatus)

Figure 8:
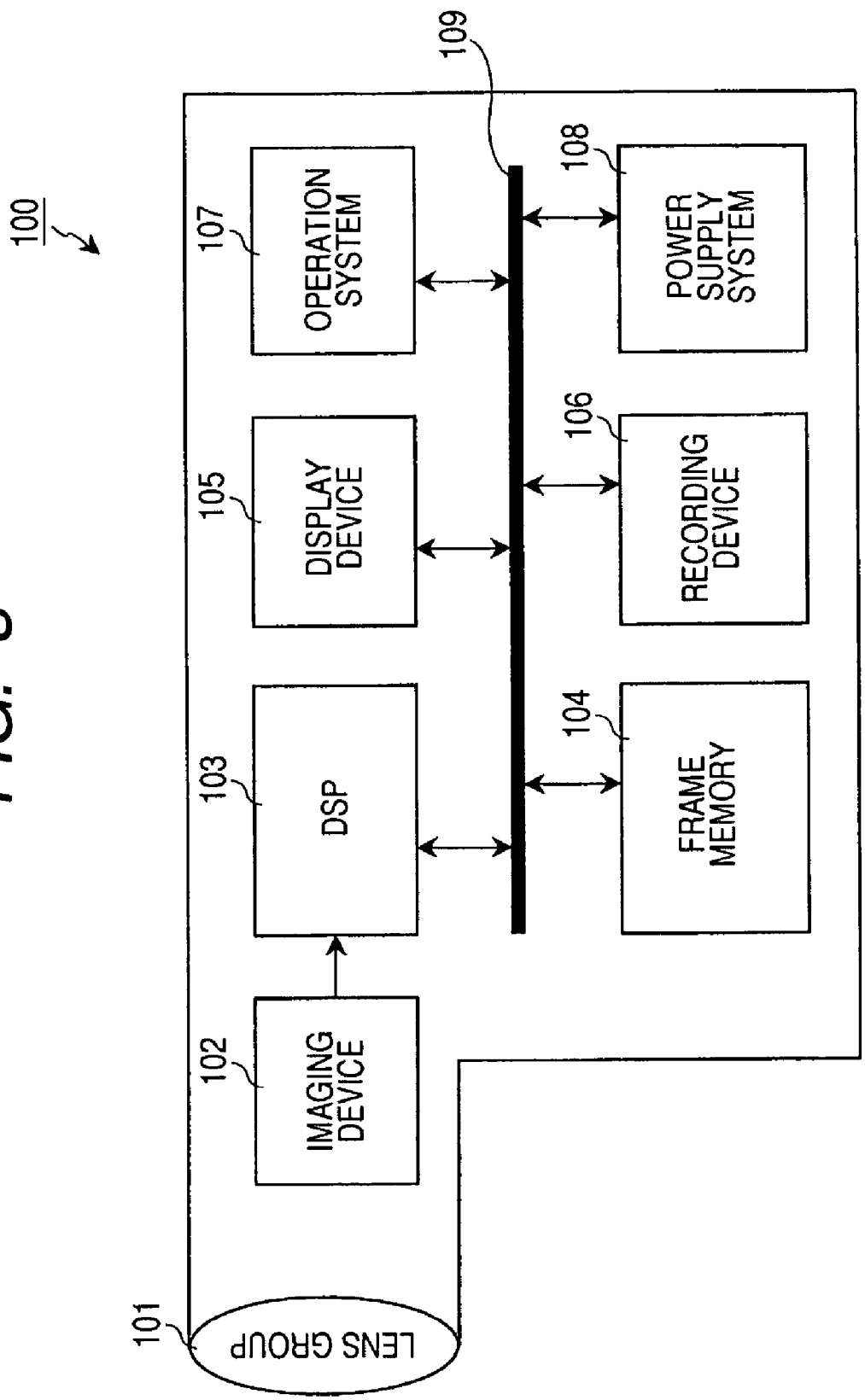
FIG. 8 is a block diagram showing an example of a configuration of an imaging apparatus according to an embodiment of the invention.
Figure 9A:
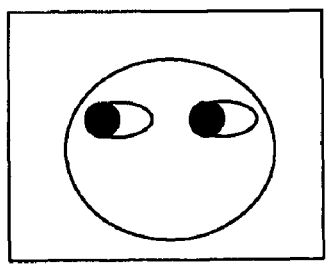
FIG. 9A is a view showing a taken image of the front-illuminated type and FIG. 9B is a view showing a taken image of the back-illuminated type.
Figure 9B:
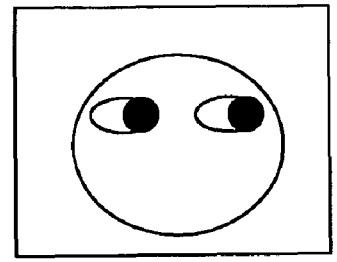
Figure 10A:
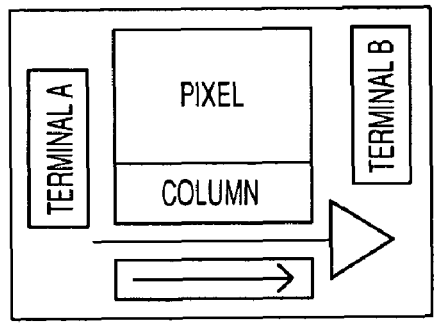
FIG. 10A and FIG. 10B are diagrams showing design data of chips of the front-illuminated and back-illuminated CMOS image sensors.
Figure 10B:
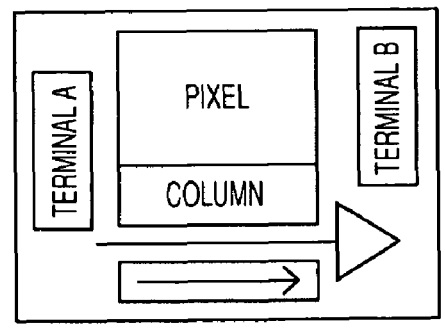
Figure 11A:
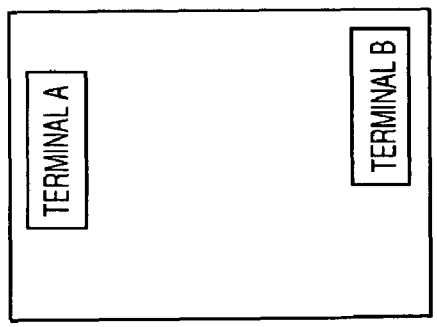
Figure 11B:
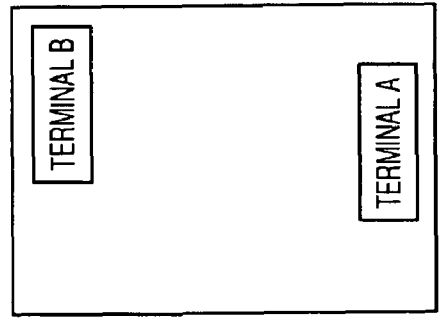
Figure 12A:
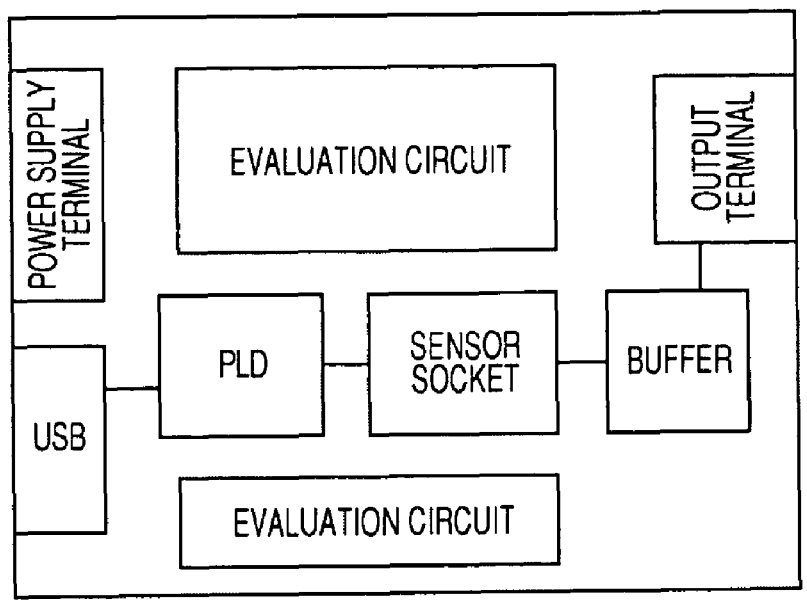
Figure 12B:
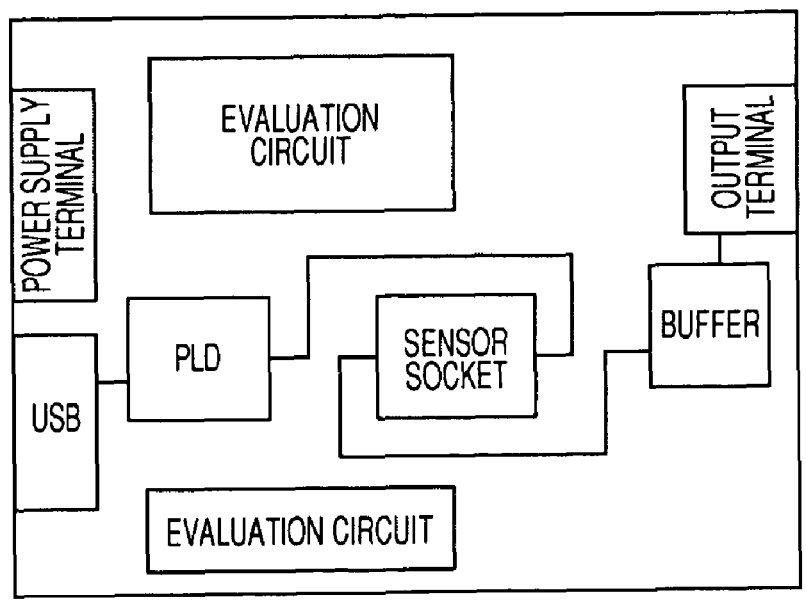
Figure 13A:
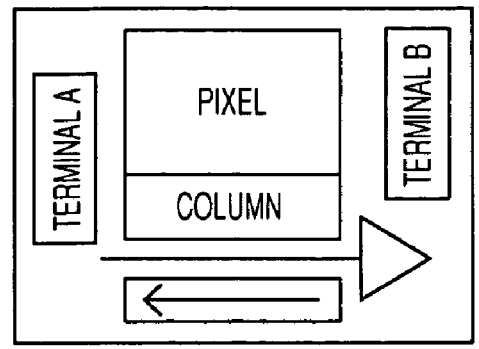
FIG. 13A to FIG. 13C are explanatory diagrams concerning Related Art 1.
Figure 13B:
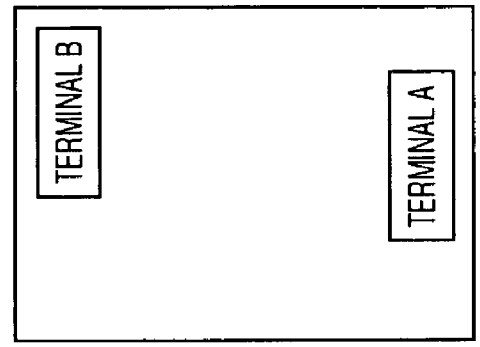
Figure 13C:
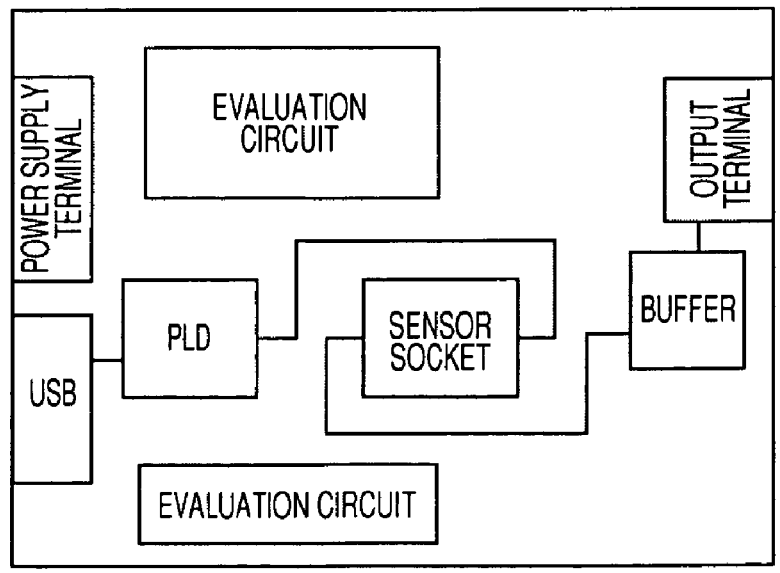

FIG. 8 is a block diagram showing an example of a configuration of, for example, an imaging apparatus as one of electronic devices according to an embodiment of the invention. As shown in FIG. 8, an imaging apparatus 100 according to an embodiment of the invention includes an optical system including a lens group 101 and the like, an imaging device 102, a DSP circuit 103 which is a camera signal processing circuit, a frame memory 104, a display device 105, a recording device 106, an operation system 107 and a power supply system 108, and the DSP circuit 103, the frame memory 104 the display device 105, the recording device 106, the operation system 107 and the power supply system 108 are connected to one another through a bus line 109.

The lens group 101 takes incident light from a subject (image light) and images the light on an imaging surface of the imaging device 102. The imaging device 102 converts the light amount of incident light imaged on the imaging surface by the lens group 101 into an electric signal by each pixel, outputting the signal as a pixel signal. The back-illuminated solid-state imaging device such as the CMOS image sensor 10 according to the above application example can be used as the imaging device 102.

The display device 105 includes a panel-type display device such as a liquid crystal display device or an organic EL (electroluminescence) display device, displaying moving pictures or still pictures imaged by the imaging device 102. The recording unit 106 records moving pictures or still pictures imaged by the imaging device 102 in a recording medium such as a video tape or a DVD (Digital Versatile Disk).

The operation system 107 provides operational instructions to various functions included in the imaging apparatus under operation by the user. The power supply system 108 appropriately supplies various power supply as operation power supply for the DSP circuit 103, the frame memory 104, the display device 105, the recording device 106 and the operation system 107 to these objects of supply.

As described above, the following operational effects can be obtained by applying the back-illuminated CMOS image sensor 10 according to the above embodiments as the imaging device 102 in imaging apparatuses, for example, a video camera, a digital still camera and a camera module for mobile devices such as a cellular phone device. That is, the back-illuminated CMOS image sensor 10 according to the embodiments can be used in the same manner as the front-illuminated CMOS image sensor of related art, therefore, it is possible to input products earlier and to reduce costs as well as to reduce the risk of unexpected disadvantages.

It should be understood by those skilled in the art that various modifications, combinations, sub-combinations and alterations may occur depending on design requirements and other factors insofar as they are within the scope of the appended claims or the equivalents thereof.

What is claimed is:

1. A method of forming a mask for lithography, comprising the step of:
    forming the mask by using reverse data in which positions of at least part of output terminals are reversed, when forming the mask for lithography used for manufacturing a back-illuminated solid-state imaging device which takes incident light from the side of a surface opposite to the side of a surface on which wiring of a device region in which photoelectric conversion elements are formed is formed.

2. The method of forming the mask for lithography according to claim 1, further comprising the steps of:
    forming layout data of a chip of the solid-state imaging device;
    forming the reserve data in which the layout data is mirror-reversed as the whole chip; and
    forming the mask by using the reverse data after that.

3. The method of forming the mask for lithography according to claim 2,
    wherein a mark arranged on the chip as data different from the layout data and the different data is superimposed on the reverse data to be the reverse data.

4. The method of forming the mask for lithography according to claim 3,
    wherein the mark is a mark used for matching for lithography, a mark used for examination in manufacturing processes, a mark for specifying a chip or a mark used as a reference of coordinates at the time of examination in the manufacturing process.

5. The method of forming the mask for lithography according to claim 2,
    wherein the mask is formed by fitting the reverse data in a frame in which the reverse operation is not performed.

6. The method of forming the mask for lithography according to claim 1,
    wherein the back-illuminated solid-state imaging device includes an output circuit unit in which an output stage has a differential output configuration, a positive-phase output terminal and a negative-phase output terminal which output a positive-phase signal and a negative-phase signal outputted from the output circuit unit to the outside of the chip, and
    wherein positions of the positive-phase output terminal and the negative-phase output terminal are replaced when forming the reverse data.

7. The method of forming the mask for lithography according to claim 6,
    wherein a library in which positions of the positive-phase output terminal and the negative-phase output terminal are replaced is made, and the reverse data is formed by using the library.

8. A method of forming mask data for lithography, comprising the steps of:
    forming layout data of a chip of a solid-state imaging device; and
    forming reverse data in which the layout data is mirror-reversed as the whole chip to allow the reverse data to be the mask data, when forming mask data for lithography used for manufacturing a back-illuminated solid-state imaging device which takes incident light from the side of a surface opposite to the side of a surface on which wiring of a device region in which photoelectric conversion elements are formed is formed.

9. A method of manufacturing a back-illuminated solid-state imaging device, comprising the steps of:
    forming layout data of a chip of a back-illuminated solid-state imaging device which takes incident light from the side of a surface opposite to the side of a surface on which wiring of a device region in which photoelectric conversion elements are formed is formed;
    forming reverse data in which the layout data is mirror-reversed as the whole chip;
    forming the mask by using the reverse data; and manufacturing the solid-state imaging device by using the formed mask.

10. The method of manufacturing the back-illuminated solid-state imaging device according to claim 9,
wherein inclination of ion implantation with respect to a semiconductor substrate is mirror-reversed so as to correspond to the reversal of the layout data when manufacturing the solid-state imaging device by using the formed mask.

* * * * *